(12) United States Patent
Nakajima (10) Patent No.: US 6,214,724 B1
(45) Date of Patent: Apr. 10, 2001

(54) SEMICONDUCTOR DEVICE AND MANUFACTURING METHOD THEREFOR

(75) Inventor: Kazuaki Nakajima, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 08/988,554

(22) Filed: Dec. 11, 1997

(30) Foreign Application Priority Data

Dec. 16, 1996 (JP) .................................................. 8-335709

(51) Int. Cl.[7] .................................................. H01L 21/44
(52) U.S. Cl. .......................... 438/656; 438/585; 438/595; 438/684; 438/770
(58) Field of Search .................................. 438/656, 703, 438/425, 426, 427, 585, 595, 684, 770

(56) References Cited

U.S. PATENT DOCUMENTS

| 5,358,892 | * | 10/1994 | Rolfson | 438/703 |
| 5,773,310 | * | 6/1998 | Park | 438/770 |
| 5,888,881 | * | 3/1999 | Jeng et al. | 438/425 |

* cited by examiner

Primary Examiner—David Nelms
Assistant Examiner—Renee R. Berry
(74) Attorney, Agent, or Firm—Finnegan, Henderson, Farabow, Garrett, & Dunner, L.L.P.

(57) ABSTRACT

The semiconductor device comprises a semiconductor substrate, a gate insulating film formed on the semiconductor substrate and a gate electrode formed on the gate insulating film. The gate electrode is formed of one of a film formed of conductive metal oxide film and a stacked-film constituted of the conductive metal oxide film and a metal film formed thereon.

15 Claims, 4 Drawing Sheets

SEMICONDUCTOR DEVICE AND MANUFACTURING METHOD THEREFOR

BACKGROUND OF THE INVENTION

This invention relates to a semiconductor device and the manufacturing method therefor, particularly to the semiconductor device related to gate electrode and gate wiring, and the manufacturing method therefor.

In recent years, the demand for increasing an integrated circuit in integration density and operating speed have increased more and more. To satisfy such demand, the reduction of the resistance of the inner wiring material and the like has been studied while the distance among elements and the element size are also required to be decreased. The RC delay occurs particularly in word lines, and it has been thus demanded to reduce the resistance of the word line, above all.

In order to obtain the word line having low resistance, a polycide gate constituted of a polysilicon layer and a metal silicide layer has been used in various devices, as the latest trend. The polycide film formed from refractory metal has a lower resistance than that of a polysilicon film by almost one digit, and is a suitable material for forming the low-resistance wiring. Tungsten silicide ($WSi_x$) is the most popular material as the metal silicide constituting such a polycide film.

While, in order to reduce the delay time in such a fine line as thin as 0.25 $\mu$m or below, further reduction of the resistance of the wiring is required. In order to obtain the gate electrode having sheet resistance lower than 10 $\Omega$/square with use of the polycide structure, the silicide layer must be formed thick. The thick silicide layer, however, makes it difficult to process the gate electrode pattern and to form the interlayer insulating film on the gate electrode.

In order to solve the problem, it has been thus required to attain the low sheet resistance of the gate electrode without increasing the aspect ratio of the gate electrode. To attain this object, it is essential to develop a metal gate formed by depositing a metal having lower resistivity than that of the metal silicide, directly on a gate oxide film.

Such a low-resistivity metal gate electrode, however, cannot be obtained unless various problems which have not coped with are overcome: work function, reliability of the interface between the electrode and gate insulating film, and the like.

It is particularly important for attaining the low-resistance metal gate electrode that the oxide of the electrode material should not be more stable than the gate insulating film on no account. For example, alumina ($Al_2O_3$), the oxide of aluminum is more stable than a silicon oxide film. Therefore, if aluminum is brought into contact with a silicon oxide film, the silicon oxide film is reduced in the interface thereof and alumina is produced therein. Accordingly, when such metal as aluminum is used to form a gate electrode, the gate oxide film is decreased in thickness by the reduction.

As described above, it is necessary in forming a metal gate electrode to select the material the oxide of which is less stable than the gate insulating film. However, some gate insulating films reduced by the metal gate electrodes have been reported (IEEE, Trans. Electron Devices, ED-31, 1174 [1984]), even if the metal materials used for forming the gate electrode satisfies this requirement. This requirement is thus not always suitable for forming the gate electrode.

Figure 1:
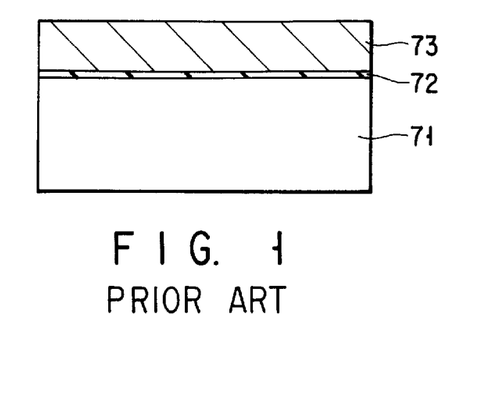
FIG. 1 is a sectional view of the gate electrode (wiring) according to the conventional manufacturing method.

One of the reported gate insulating films reduced by the metal gate electrodes will be described below more specifically with reference to FIG. 1.

A sample was prepared in the following manner:

A thin silicon oxide film 72 (4 nm thick) was formed on a monocrystalline silicon substrate 71 in the thermal oxidation process. On the thin silicon oxide film 72, a molybdenum (Mo) film 73 (100 nm thick) was deposited in the sputtering process using an Mo target and Ar gas as a sputtering gas. The sample was then subjected to a heat treatment at 1000° C.

As a result of the observation of the cross sectional view of the sample with use of a transmission electron microscope, the silicon oxide film 72 was observed to be partially reduced to be decreased in thickness.

The decrease of Gibbs' free energy when the molybdenum produces the oxide thereof is larger than that of Gibbs' free energy when the silicon produces the oxide thereof. Accordingly, from the thermodynamic point of view, the silicon oxide cannot be reduced by molybdenum. In a silicon oxide film, however, a partial reduction may occur by the metal introducing into the silicon oxide film during the deposition of the metal film, with the result that the reliability of the gate oxide film will be remarkably decreased.

As described above, when the metal gate electrode is used, the interface between the metal film and the gate insulating film cannot be easily controlled unlike the case using the conventional polysilicon film to form the gate electrode.

In addition thereto, problems in the manufacturing method will also occur in the device using the metal gate electrode. In particular, the size of the gate electrode notably affects the operation characteristics of the transistor, and thus high processing technique is required to obtain a desired size. The metal film, however, cannot be easily etched with high selectivity to a gate insulating film, unlike the conventional polysilicon film. For example, the etching selectivity of a tungsten film to a silicon oxide film is as low as 2–10. With such low etching selectivity, the silicon oxide film located below a gate electrode formed of the tungsten film will be etched during the tungsten film is etched. In the worst case, the etching solution may penetrate the silicon oxide film to etch the substrate. The fine pattern applicable to the 0.15 gate-width generation devices thus cannot be formed with such low etching selectivity.

The specific example of the etching with such low etching selectivity will be described below with reference to FIGS. 2A–2C.

Figure 2A:
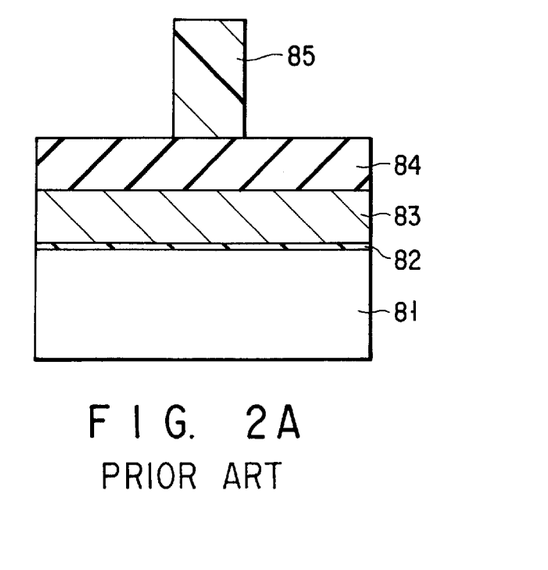
FIGS. 2A–2C are sectional views of the gate electrode, which show each step of the conventional manufacturing method.

As shown in FIG. 2A, a thin silicon oxide film 82 (4 nm thick) is formed on a monocrystalline silicon substrate 81 in the thermal oxidation process. On the thin silicon oxide film 82, a tungsten (W) film 83 (100 nm thick) is deposited in the sputtering process with use of a W target and Ar gas as a sputtering gas. A 200 nm thick silicon nitride film is then deposited on the tungsten film 83 in the CVD process. Subsequently, the sample is applied with photoresist with 1 $\mu$m thickness in the spin-coat process, and then exposed to light to develop a resist pattern. Consequently, a resist pattern 85 presenting 0.15 $\mu$m width gate electrodes is formed.

Figure 2B:
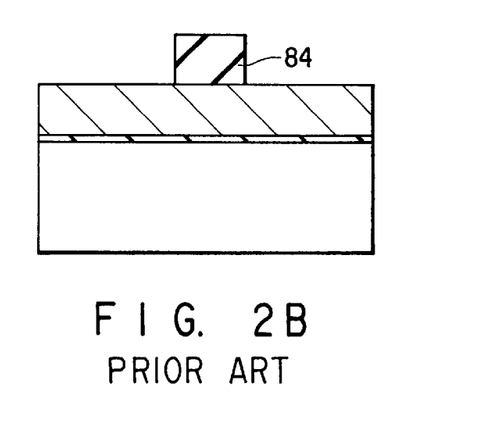

The silicon nitride film 84 is then etched using the resist pattern 85 as an etching mask and $CHF_3/CH_4$ gas as an etching gas, as shown in FIG. 2B. The resist pattern 85 left after the etching process is then removed in the oxide plasma ashing process to obtain a mask pattern formed of the silicon nitride film 84.

Figure 2C:
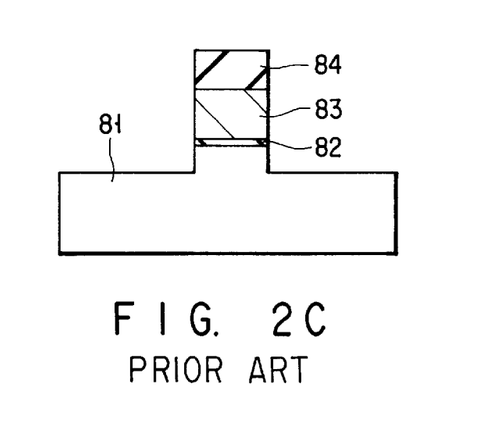

Next, the tungsten film 83 is etched with use of the silicon nitride film 84 as an etching mask and $SF_6/Cl_2$ mix gas as an etching gas, as shown in shown in FIG. 2C. The etching process is performed under the condition where RF power is 1.0 W/cm², gas pressure is 10 mTorr, the flow rates of SF₆/Cl₂ gas are 100 and 5 SCCM, respectively, and the temperature of the lower electrode is maintained at 80° C. In this time, the tungsten film 83 is etched at an etching rate of 100 nm/min. While, the silicon oxide film 82 is etched at an etching rate below 20 nm/min. The etching selectivity in this time is as low as 5, and thus the silicon substrate 81 will be also etched.

Such low etching selectivity to the lower film will cause some problems particularly in the case where the substrate has some steps.

Figure 3:
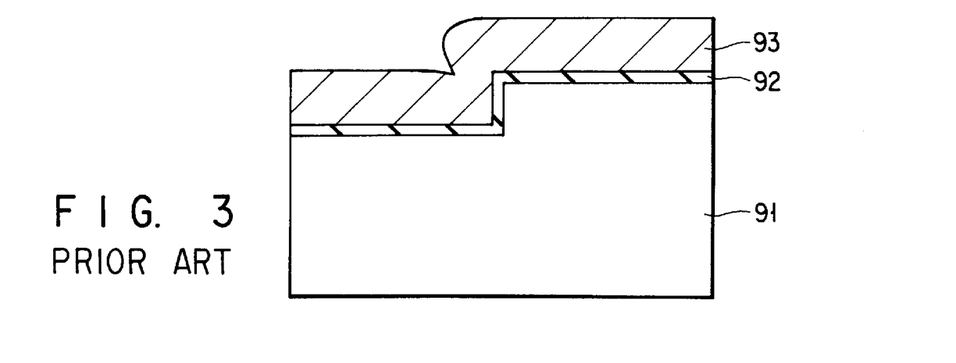
FIG. 3 is a sectional view of the gate electrode, which shows the problems occur in the conventional manufacturing method.

FIG. 3 shows such a case where the lower substrate has some steps. When a thin oxide film 92 and a tungsten film 93 are deposited on a substrate 91 having steps, the thickness of the deposited tungsten film will increase at the steps. In the anisotropic etching process, the film is etched vertically to the surface of the film to be etched. Therefore, when the film formed in such a shape is subjected to the anisotropic etching process, the etching process longer in time than the normal etching process, i.e., "overetching" needs to be performed in order to completely etch the film at the steps. Such an overetching process has to be performed to completely etch the film so as not to leave any portion not etched due to the height of the steps and variation of the etching rate. By performing the overetching process, the reliability of the semiconductor device will be improved.

However, it is also a fact that the under film located below the objective film to be etched will be also etched in the overetching process. When the under film below the objective film is formed from the material having low etching selectivity to the objective film, the most of the under film will be etched during the overetching process for the objective film. For example, when the overetching process is performed for the tungsten film 93, the etching selectivity of which to the silicon oxide film 92 is 5, up to 50% of the thickness thereof (at which the tungsten film 93 can be etched by 50 nm thick), the silicon oxide film 92 will be also etched by 10 nm thick on a calculation. In short, not only all of the gate oxide film 92 will be etched during the forming process of the tungsten film 93, but also the substrate 91 will be also etched.

To prevent such too-much etching, a barrier metal film such as titanium nitride film was inserted between the metal film and the insulation film in the device, but the etching selectivity of the upper film to the oxide film located therebelow cannot be easily increased even with use of such a barrier metal film.

As described above, unlike the polysilicon film which has been conventionally used to form a gate electrode, sufficient reliability and controllability of the interface of the metal film and the gate insulating film cannot be attained when the gate electrode is formed of a metal film. In addition, the metal film cannot be easily etched with high etching selectivity to the gate insulating film, and thus the gate electrode cannot be formed with high precision.

Further to say, general gate wiring will be formed with use of the film constituting the gate electrode, when the gate wiring is formed of a metal film, however, sufficient adhesion cannot be easily attained between the metal film and the lower insulating film.

BRIEF SUMMARY OF THE INVENTION

The first object of the present invention is to provide a semiconductor device, capable of improving the reliability and controllability of the interface of a metal film and a gate insulating film.

The second object of the present invention is to provide a manufacturing method for a semiconductor device capable of improving the reliability and controllability of the interface of a metal film and a gate insulating film, and forming a gate electrode with high precision.

The third object of the present invention is to provide a semiconductor device, capable of improving the adhesion between a gate electrode or gate wiring and an insulating film therebelow, and of reducing the resistance of the gate electrode and the gate wiring.

In order to attain the first object, the semiconductor device according to the first aspect of the present invention comprises: a semiconductor substrate; a gate insulating film formed on the semiconductor substrate; and a gate electrode formed on the gate insulating film, the gate electrode being formed of one of a film formed of conductive metal oxide film and a stacked-film constituted of the conductive metal oxide film and a metal film formed thereon.

The semiconductor device further comprises a plurality of gate electrodes comprising the gate electrode as one unit thereof; and a plurality of gate wires connecting the plurality of gate electrodes, wherein each of the plurality of gate wires may be formed of one of the conductive metal oxide film and the stacked-film constituted of the conductive metal oxide film and the metal film formed thereon.

The conductive metal oxide film is preferably an oxide film of any one metal selected from a group of Mo, W, Tc, Re, Ru, Os, Rh, Ir, Pd, Pt, In, and Sn, and an oxide film of an alloy formed from metals in the group.

The metal film can include at least one of Mo, W, Ti, Co, Cr, and Zn.

The gate insulating film is preferably formed of one of silicon oxide film, silicon nitride film silicon oxynitride film, tantalum oxide film, and strontium titanate film.

The semiconductor device can further comprise source and drain regions formed on the semiconductor substrate along both sides of the gate electrode.

According to the above-mentioned semiconductor device, the conductive metal oxide film contains oxygen with high concentration, and thus the movement of oxygen during the reduction in the interface of the conductive metal oxide film and the gate insulating film can be suppressed. Accordingly, the reliability and controllability of the interface of the gate electrode and the gate insulating film will be improved. Further, the under oxide film below the gate electrode is formed to be placed under the conductive metal oxide film with strong adhesion, and thus the adhesion between the gate electrode or the gate wiring and the under oxide film can be improved in comparing with the case where the metal film directly formed on the oxide film below the gate electrode. In addition, when the gate electrode and the gate wiring are formed of the stacked-film, the resistance of the gate electrode and gate wiring can be reduced since a metal film is normally higher than the conductive metal oxide film in conductivity.

The semiconductor device according to the second aspect of the present invention comprises: a semiconductor substrate; a plurality of MOS transistors arranged in rows and columns on the semiconductor substrate, each of the MOS transistors having a first insulating film formed on the semiconductor substrate, a gate electrode formed on the first insulating film, and a source and a drain region formed on the semiconductor substrate so as to locate the gate electrode therebetween; a plurality of capacitors each connected to the source region of a corresponding one of the MOS transistors; a plurality of word lines formed above the semiconductor substrate to locate the second insulating film therebetween and to be arranged in an arrangement direction of the rows, each of the plurality of word lines being connected to the gate electrode of a corresponding one of the MOS transistors arranged in a direction of the rows; and a plurality of bit lines arranged in an arrangement direction of the columns, each of the bit lines being connected to the drain region of a corresponding one of the MOS transistors arranged in a direction of the columns, wherein both the gate electrode and of the plurality of word lines include one of a conductive metal oxide film and a stacked-film constituted of the conductive metal oxide film and a metal film formed thereon.

Each of the word lines is constituted of gate wiring comprising the gate electrode formed of the same material as that of the gate electrode and connected to the gate electrode of each of the MOS transistors in common; and upper wiring connected to the gate wiring through a plurality of contact holes arranged such that at least two of the MOS transistors can be arranged between adjacent two of the contact holes.

The conductive metal oxide film is preferably one of the oxide film of any one metal selected from a group of Mo, W, Tc, Re, Ru, Os, Rh, Ir, Pd, Pt, In, and Sn, and an oxide film of an alloy formed from metals in the group.

The first and second insulating films are preferably formed of one of silicon oxide film, silicon nitride film silicon oxynitride film, tantalum oxide film, and strontium titanate film.

According to the above-mentioned semiconductor device, the resistance of the gate wiring can be reduced, and thus the delay time in the gate wiring can be reduced. Accordingly, the distance between the contact holes adjacent to each other can be increased. In other words, the number of the MOS transistors arranged between the adjacent contact holes can be increased, and thus the total number of the contact holes in one line can be reduced. By virtue of this feature, the semiconductor device with high integration density can be obtained.

The semiconductor device manufacturing method according to the third aspect of the present invention comprises the steps of: forming a gate insulating film on a semiconductor substrate; forming a conductive metal oxide film on the gate insulating film to make a stacked-layer film; and forming a gate electrode by etching the stacked-layer film.

The above-mentioned manufacturing method can further comprise, after the step of forming the conductive metal oxide film, a step of forming a metal film on the conductive metal oxide film.

The conductive metal oxide film is preferably one of an oxide film of any one metal selected from a group of Mo, W, Tc, Re, Ru, Os, Rh, Ir, Pd, Pt, In, and Sn, and an oxide film of an alloy formed from metals in the group.

The gate insulation film is preferably formed of one of silicon oxide film, silicon nitride film, silicon oxynitride film, tantalum oxide film, and strontium titanate film.

The semiconductor device manufacturing method according to the fourth aspect of the present invention comprises the steps of: forming a gate insulating film on a semiconductor substrate; forming a conductive metal oxide film on the gate insulating film; forming a metal film on the conductive metal oxide film; selectively etching the metal film to the conductive metal oxide film so as to expose the conductive metal oxide film; and selectively etching the exposed conductive metal oxide film to the gate insulating film in order to form a gate electrode.

The above-mentioned step of selectively etching the exposed conductive metal oxide film to the gate insulating film preferably includes a step of etching the exposed conductive metal oxide film with use of an oxygen containing gas.

The gas containing oxygen preferably contains at least one of $O_2$, NO, $NO_2$, $O_3$, CO, and $CO_2$.

The step of etching with use of the oxygen containing gas is preferably performed with use of supplementary gas for forming vapor of metal peroxide.

The supplementary gas preferably contains one of $CCl_2$, $SF_6$, $CH_4$, and $CCl_4$.

The conductive metal oxide film is preferably one of an oxide film of any one metal selected from a group of Mo, W, Tc, Re, Ru, Os, Rh, Ir, Pd, Pt, In, and Sn, and an oxide film of an alloy formed from metals in the group.

According to the above-mentioned manufacturing method, the gate electrode is formed of the conductive metal oxide film or the stacked-film constituted of the conductive metal oxide film and the metal film formed thereon, and thus the gate insulating film is located under the conductive metal oxide film. The conductive metal oxide film contains oxygen with high concentration. The movement of oxygen during the reduction in the interface of the conductive metal oxide film and the gate insulating film is suppressed thereby, and thus the reliability and controllability of the interface of the gate electrode and the gate insulating film will be improved.

Further, according to the above-mentioned method, the gate electrode can be formed with high precision. More specifically, when the conductive metal oxide is used for forming the gate electrode, oxygen can be used as an etching gas since a steam pressure of metal peroxide ($RuO_4$, for example) is so high. The conductive metal oxide therefore can be etched with high selective etching rate to the gate insulating film.

In addition, when the stacked-film is used as the gate electrode, the metal film can be etched with high selective etching rate to the conductive metal oxide film, since the conductive metal oxide film ($RuO_2$, for example) cannot easily react with halogen such as F and Cl used for etching the metal film. Accordingly, the conductive metal oxide film and the metal film can be etched with high selective etching rate to the film located below the films, and thus the gate electrode can be formed with high precision.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A and 4B are sectional views of the gate electrode according to the manufacturing method of the first embodiment of the present invention, for showing the steps of the manufacturing method. FIG. 4A shows a conductive metal oxide film as a gate electrode, and FIG. 4B shows a stacked-layer film as a gate electrode, which is constituted of a conductive metal oxide film and a metal film formed thereon.

FIGS. 7A–7C show an MOS memory device according to the manufacturing method of the fourth embodiment of the present invention.

DETAILED DESCRIPTION OF THE INVENTION

The embodiments of the present invention will be described below with reference to the drawings.

[The first embodiment]

The semiconductor device according to the first embodiment of the present invention will be described at first with reference to FIGS. 4A and 4B. The present embodiment relates to the case where the present invention is applied to a gate electrode.

Figure 4A:
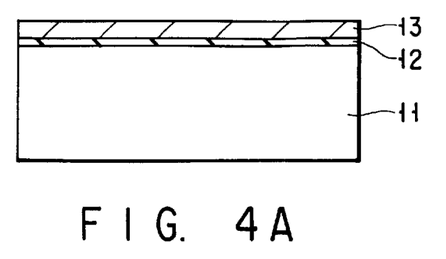

FIG. 4A shows the case where a conductive metal oxide film is used as a gate electrode.

Firstly, a thin silicon oxide film 12 having a thickness of 4 nm is formed on a monocrystalline silicon substrate 11 in the thermal oxidation process. Subsequently, an iridium oxide film 13 having a thickness of 10 nm is deposited in the reactive sputtering process using an Ir target and Ar and $O_2$ gases as sputtering gases.

As a result of the observation of the sectional view of this sample with use of a transmission electron microscope, no change was observed in the silicon oxide film after the sputtering process, and thus this structure was proved to be distinguishably stable. The stability of this structure is brought by the high concentration oxygen contained in the conductive metal oxide film such as an iridium oxide film, which suppresses the movement of oxygen from the conductive metal oxide film to the gate insulating film in the interface of the conductive metal oxide film and the gate insulating film during the reduction during the reduction.

Figure 4B:
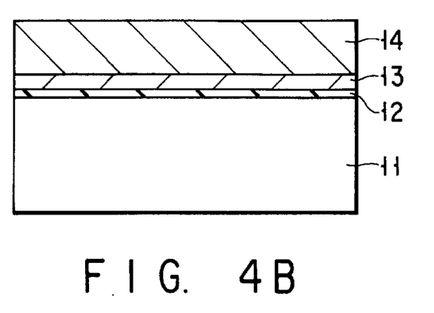

FIG. 4B shows the case where a stacked-film which is constituted of a conductive metal oxide film and a low-resistance metal film formed thereon is used as a gate electrode.

Similarly to the case shown in FIG. 4A, a thin silicon oxide film 12 having a thickness of 4 nm is formed on a monocrystalline silicon substrate 11 in the thermal oxidation process. Subsequently, an iridium oxide film 13 having a thickness of 10 nm is deposited in the reactive sputtering process using an Ir target and Ar and $O_2$ gases as sputtering gases. The iridium oxide film 13 is then submitted to the sputtering process using an Mo target and Ar gas as a sputtering gas to obtain a molybdenum film 14 having a thickness of 100 nm.

By stacking a refractory metal film such as a molybdenum film which has higher conductivity than a conductive metal oxide film on the conductive metal oxide film in this manner, the resistance of the gate electrode can be reduced in comparing with the case shown in FIG. 4A wherein the gate electrode is constituted only of the conductive metal oxide film. Therefore, according to the present embodiment, a low-resistance gate electrode can be obtained without deteriorating the gate insulating film.

[The second embodiment]

The second embodiment of the present invention will be described next with reference to FIGS. 5A–5D. The present embodiment relates to the manufacturing steps in the case where the present invention is applied to a gate electrode.

Figure 5A:
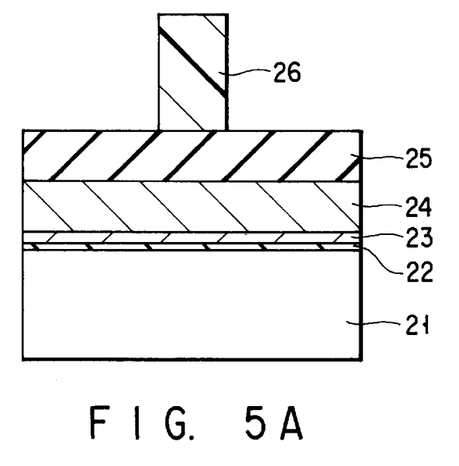
FIGS. 5A–5D are sectional views of a gate electrode according to the manufacturing method of the second embodiment of the present invention, which show each step of the manufacturing method of the gate electrode.

As shown in FIG. 5A, a thin silicon oxide film 22 having a thickness of 4 nm is formed on a monocrystalline silicon substrate 21 in the thermal oxidation process. Subsequently, a ruthenium oxide film 23 having a thickness of 10 nm is deposited on the thin silicon oxide film 22 in the reactive sputtering process using a Ru target and Ar and $O_2$ gases as sputtering gases.

The above step will be followed by the sputtering process wherein a tungsten film 24 having a thickness of 100 nm is deposited on the ruthenium oxide film 23, using a W target and Ar gas as a sputtering gas. The tungsten film 24 is then subjected to the CVD process to obtain a silicon nitride film 25 having a thickness of 200 nm deposited thereon. Subsequently, photoresist is applied by about 1 $\mu$m to the silicon nitride film 25 with use of the spin-coat method. The photoresist is exposed to light and developed to obtain a resist pattern 26 having a 0.15 $\mu$m width.

Figure 5B:
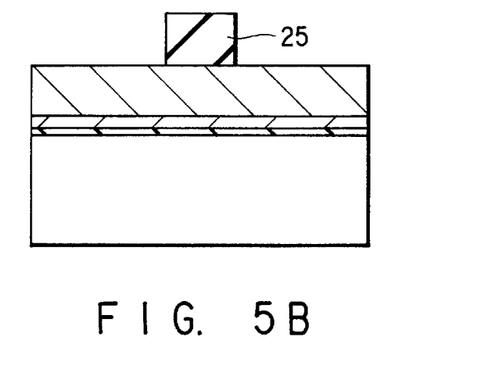

FIG. 5B shows the next step in which the silicon nitride film 25 is etched with use of the resist pattern 26 as an etching mask and $CHF_3/CF_4$ mixed gas as an etching gas. Then, the oxygen plasma ashing process is performed to remove the resist pattern 25 not etched, then a mask pattern formed of the silicon nitride film 25 is formed.

Figure 5C:
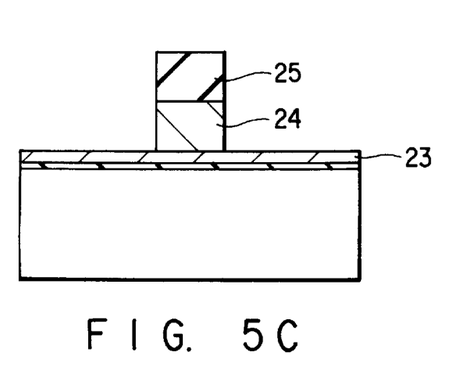
Figure 5D:
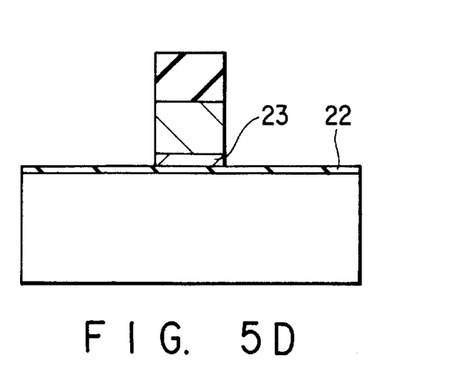

Next, as shown in FIG. 5C, the tungsten film 24 is etched with use of the silicon nitride film 25 as an etching mask and $SF_6/Cl_2$ mixed gas as an etching gas. The etching process is performed under the condition where the applied high frequency electric power is 1.0 W/$cm^2$, the gas pressure is 10 mTorr, the flow rates of the $SF_6$ gas and $Cl_2$ gas are respectively 20 and 30 SCCM, and the temperature of the lower electrode is maintained at 40° C.

In this time, the tungsten film 24 is etched at 200 nm/min, and the ruthenium oxide film 23 is etched below 1 nm/min. The etching selectivity in this time is over 100. Therefore, the ruthenium oxide film 23 under the tungsten film 24 can be left hardly etched.

Subsequently, the ruthenium oxide film 23 is etched with use of the silicon nitride film 25 and the tungsten film 24 as an etching mask as shown in FIG. 5C, and $O_2/Cl_2$ mixed gas as an etching gas. The etching process is performed under the condition where the applied high frequency electric power is 1.0 W/$cm^2$, the gas pressure is 40 mTorr, the flow rates of the $O_2$ gas and $Cl_2$ gas are respectively 90 and 10 SCCM, and the temperature of the lower electrode is maintained at 60° C.

In this time, the ruthenium oxide film 23 is etched at 100 nm/min, and the silicon oxide film 22 is etched below 1 nm/min. The etching selectivity in this time is over 100. Therefore, the silicon oxide film 22 under the ruthenium oxide film 23 can be left hardly etched.

As described above, when the stacked-film, which is constituted of the conductive metal oxide film such as a ruthenium oxide film and the refractory metal film such as a tungsten film, is used as a gate electrode, high etching selectivity can be attained in the etching process between the objective film to be etched and the film located under the objective film. Accordingly, the stacked-film structure is sufficiently effective to reduce a gate electrode in thickness.

In the present embodiment, the $O_2/Cl_2$ mixed gas is used as an etching gas to etch the conductive metal oxide film, but it is important above all to use the gas containing oxygen atoms as an etchant of the conductive metal oxide film. The $Cl_2$ gas used in the present embodiment functions merely as an supplementary gas to form the high-vapor pressure metal peroxide, and thus a little quantity of the gas needs to be supplied in the process. Accordingly, the conductive metal oxide film can be suitably etched with use of only the gas containing oxygen.

In the present embodiment, the other gas containing oxygen than $O_2$: $NO$, $NO_2$, $O_3$, $CO$, and $CO_2$ can be used as the etching gas. The mixed gas containing these oxygen-containing gases may be also used.

In addition to $Cl_2$, the other supplementary gas such as $SF_6$, $CF_4$, and $CCl_4$ which contain halogen can be used to be mixed with the oxygen-containing gas.

[The third embodiment]

The third embodiment of the present invention will be described with reference to FIGS. 6A–6D. The present embodiment relates to the manufacturing steps in the case where the present invention is applied to an MOS transistor.

Figure 6A:
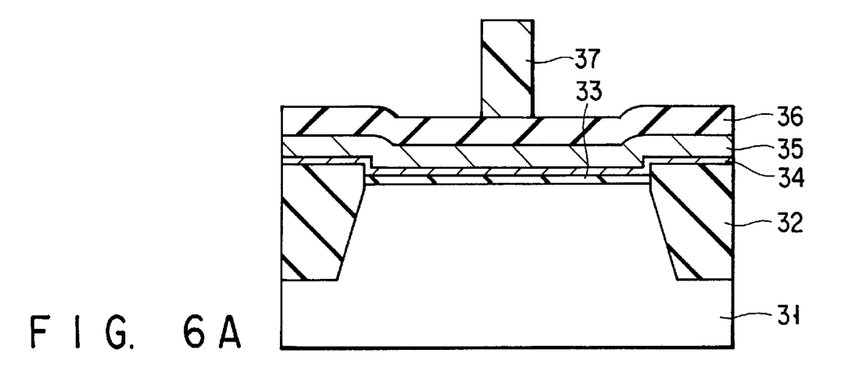
FIGS. 6A–6D are sectional views of an MOS transistor according to the manufacturing method of the third embodiment of the present invention, which show each step of the manufacturing method of the gate electrode.

As shown in FIG. 6A, an element isolation region 32 and a gate insulating film 33 of 4 nm thick are formed on a monocrystalline silicon substrate 31. Subsequently, a conductive metal oxide film 34 (10 nm thick) formed of a ruthenium oxide film or osmium oxide film is deposited in the reactive sputtering process.

The above step will be followed by the sputtering process wherein a tungsten film 35 having a thickness of 100 nm is deposited on the conductive metal oxide film 34. The tungsten film 35 is then subjected to the CVD process to obtain a silicon nitride film 36 having a thickness of 200 nm deposited thereon. Subsequently, photoresist is applied by about 1 μm to the silicon nitride film 36 in accordance with the spin-coat method. The photoresist is exposed to light through a photomask and then developed to obtain a resist pattern 37 having a 0.15 μm width.

Figure 6B:
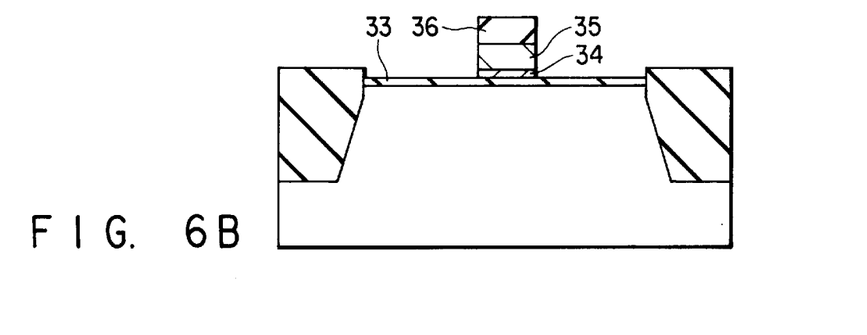

FIG. 6B shows the next step in which the resist pattern 37 is used as an etching mask to etch the silicon nitride film 36 using a dry etching apparatus. Then, the $O_2$ ashing process is performed to remove the resist pattern 37 left not etched.

Next, the tungsten film 35 is subjected to the anisotropic etching process using the silicon nitride film 36 as an etching mask. In this time, the tungsten film 35 is etched with high etching selectivity to the conductive metal oxide film, similarly to the second embodiment shown in FIGS. 5A–5D.

Subsequently, the conductive metal oxide film 34 is subjected to the anisotropic etching process with use of the silicon nitride film 36 and the tungsten film 35 as an etching mask. In this time, the conductive metal oxide film 34 is etched with high etching selectivity to the silicon oxide film, similarly to the second embodiment.

Figure 6C:
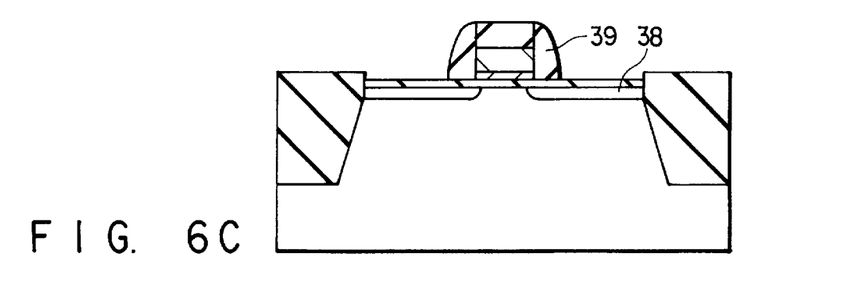

Next, a shallow impurity diffusion layer 38 is formed in a process such as an ion implantation process, as shown in FIG. 6C. Then, a sidewall insulator 39 of the gate electrode is formed with use of a silicon nitride film.

Figure 6D:
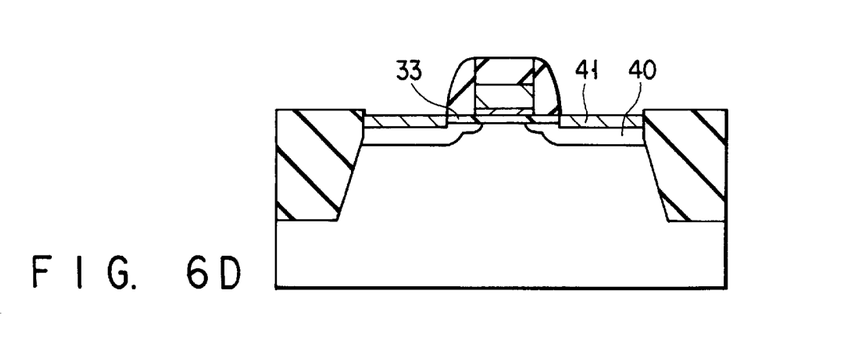

Subsequently, a deep impurity layer 40 is formed in a process such as an ion implantation process, as shown in FIG. 6D. After a part of the gate insulating film at the source and drain regions is removed with use of diluted hydrofluoric acid solution, a titanium film (20 nm thick) is deposited.

Then, a heating treatment is performed in a nitrogen atmosphere at 900° C. for 20 seconds to form a silicide layer 41 at the source and drain region of the MOS transistor. The titanium films, which are located on the isolation region 32, the silicon nitride film 36 and the sidewall insulator 39, and have not reacted, are removed thereafter with use of sulfuric acid and hydrogen peroxide.

As described above, the present embodiment uses as a gate electrode the stacked-film which is constituted of the conductive metal oxide film containing high concentration oxygen and the refractory metal film, and thus the movement of oxygen during the reduction in the interface of the conductive metal oxide film and the gate insulating film is suppressed thereby. The present invention thus can improve the reliability and controllability of the interface of the gate electrode and the gate insulating film. Further, high etching selectivity can be attained during in the etching process between the objective film to be etched and the film located under the objective film, the stacked-film structure is sufficiently effective also for reducing a gate electrode in thickness.

[The fourth embodiment]

The semiconductor device according to the fourth embodiment of the present invention will be described below with reference to FIGS. 7A–7C. The present embodiment relates to the constitution of a DRAM applied with the present invention.

The described embodiments relate to the case where the gate electrode of an MOS transistor is constituted of the conductive metal oxide film or a stacked-film constituted of a conductive metal oxide film and a refractory metal film, and no description is made for the gate wiring connecting the gate electrodes each other. Accordingly, the present embodiment relates to the case where the gate wiring has the same constitution as that of the gate electrode.

Figure 7A:
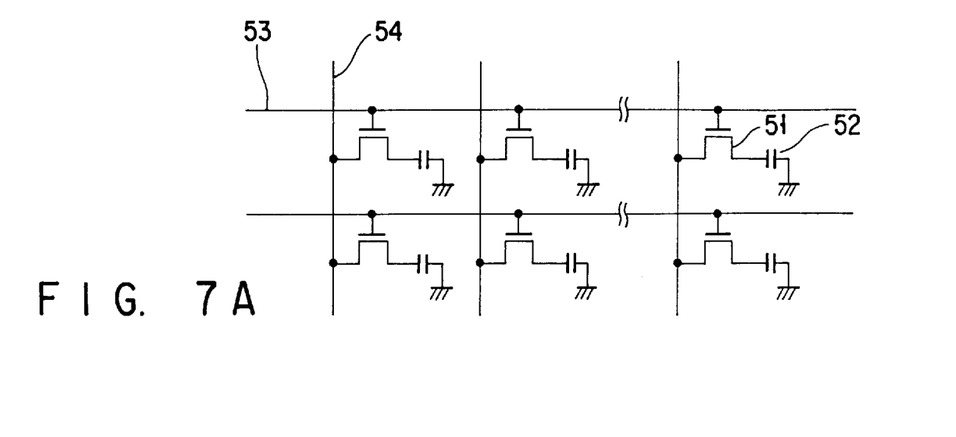
FIG. 7A shows an equivalent circuit diagram of the MOS transistor memory device.
Figure 7B:
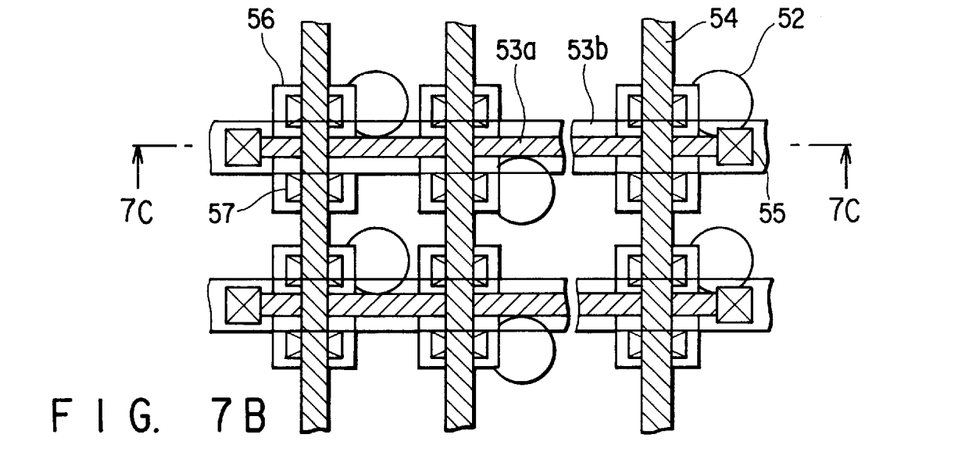
FIG. 7B shows a plan view schematically showing the memory device.
Figure 7C:
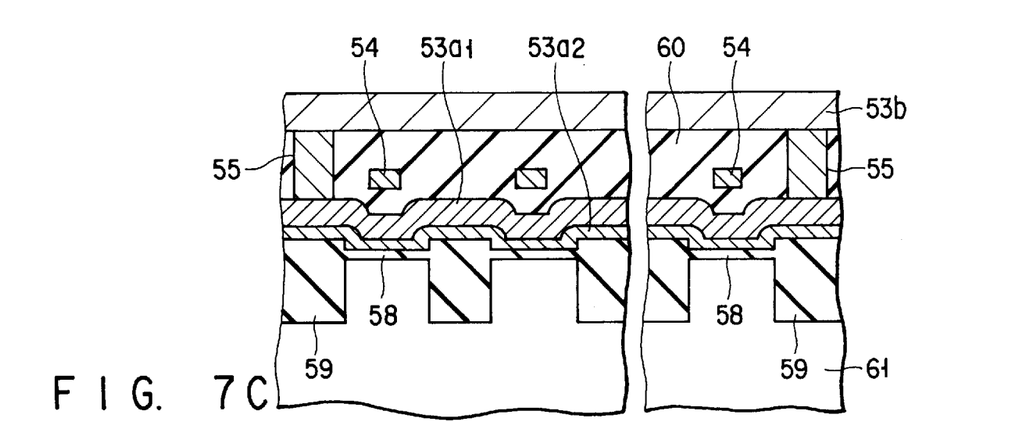
FIG. 7C shows a sectional view of the memory device taken along a line 7C—7C indicated in FIG. 7B.

FIG. 7A shows an equivalent circuit diagram of a DRAM, FIG. 7B shows a plan view schematically showing the DRAM, and FIG. 7C shows a sectional view of the DRAM. In the drawings, 51 denotes each of MOS transistors arranged in a matrix; 52 is a capacitor connected to the source of each of the MOS transistors, for storing data; 53 denotes word lines; and 54 denotes bit lines.

Each of the word lines 53 is constituted of a gate wire 53$a$ connecting the gate electrodes of the MOS transistors 51 in common and an upper wire 53$b$ (formed of aluminum, for example) connected to the gate wire 53$a$ via a plurality of contact holes 55. Between the contact holes adjacent to each other, the MOS transistors 51 more than one are provided.

The gate electrodes of the MOS transistors 51 and the gate wires 53$a$ connecting the gate electrodes each other are formed of a stacked-layer comprising a conductive metal oxide film 53$_{a2}$ and a metal film 53$_{a1}$ formed thereon. The stacked-layer is formed from basically the same material by the same forming method as described in the other embodiments.

In the drawings, 56 denotes drain and source regions of each of MOS transistors; 57 denotes contact holes each connecting the drain region of the MOS transistor 51 and the corresponding bit line; 58 denotes gate insulating films; 59 denotes element isolation regions; 60 denotes interlayer insulating film; and 61 denotes a semiconductor substrate.

The word lines 53 are formed as a double-layer structure each comprising the gate wire 53a and the upper wire 53b in order to reduce the resistance of the word lines 53 to shorten the delay time in the word line. Similarly, the gate wires 53a of the present embodiment are formed to have a stacked-layer structure comprising a conductive metal oxide film 53$_{a2}$ and a metal film 53$_{a1}$ formed thereon so as to reduce the resistance of the gate wire 53a, and thus the delay time in the gate wire 53a can be decreased.

If the delay time in the gate wire 53a connecting the contact holes adjacent to each other is decreased as described above, the gate wire 53a can be formed longer thereby. In other words, the number of the MOS transistors 51 arranged between the adjacent contact holes 55 can be increased, and thus the total number of the contact holes in one word line can be reduced. By virtue of this feature, the semiconductor device with high integration density can be obtained.

Further, the insulating film below the element isolation region is formed to be placed under the conductive metal oxide film with high adhesion, and thus the adhesion between the gate wiring and the under insulating film can be improved.

In the present embodiment, the DRAM is described as one example using the gate wiring having the same constitution as that of the gate electrode. The other semiconductor integrated circuit such as a memory device or a logic device can use the same constitution, as a matter of course.

In the above-mentioned embodiments, the conductive metal oxide film can be formed from an oxide film of any one metal selected from a group of Mo, W, Tc, Re, Ru, Os, Rh, Ir, Pd, Pt, In, and Sn, or the oxide film of the alloy formed from the metals in the group.

The metal film on the conductive metal oxide film in each embodiment can be formed from refractory metal such as Mo, W, Ti, Co, Cr, and Zn or the alloy of these metals. The nitride, carbide, or boride of these metals can be also used as the metal film. Further, the non-refractory metal such as Cu or Al or the alloy of these metal can be also used as the metal film.

In addition, the gate insulating film can be formed of a film having high dielectric constant, such as silicon nitride film silicon oxynitride film, tantalum oxide film, and strontium titanate film, though a silicon oxide film is used in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A manufacturing method of a semiconductor device, comprising the steps of:

forming a gate insulating film on a semiconductor substrate;

forming a conductive metal oxide film on the gate insulating film to make a stacked-layer film; and forming a gate electrode by etching the stacked-layer film.

2. A manufacturing method according to claim 1, further comprising, after the step of forming the conductive metal oxide film, a step of forming a metal film on the conductive metal oxide film.

3. A manufacturing method according to claim 1, wherein the conductive metal oxide film is one of an oxide film of any one metal selected from a group of Mo, W, Tc, Re, Ru, Os, Rh, Ir, Pd, Pt, In, and Sn, and an oxide film of an alloy formed from metals in the group.

4. A manufacturing method according to claim 1, wherein the gate insulating film is formed of one of silicon oxide film, silicon nitride film, silicon oxynitride film, tantalum oxide film, and strontium titanate film.

5. A manufacturing method of a semiconductor device, comprising the steps of:

forming a gate insulating film on a semiconductor substrate;

forming a conductive metal oxide film on the gate insulating film;

forming a metal film on the conductive metal oxide film;

etching the metal film selectively to the conductive metal oxide film so as to expose the conductive metal oxide film; and etching the exposed conductive metal oxide film selectively to the gate insulating film in order to form a gate electrode.

6. A manufacturing method according to claim 5, wherein the step of selectively etching the exposed conductive metal oxide film to the gate insulating film includes a step of etching the exposed conductive metal oxide film with use of an oxygen containing gas.

7. A manufacturing method according to claim 6, wherein the oxygen containing gas contains at least one of $O_2$, NO, $NO_2$, $O_3$, CO, and $CO_2$.

8. A manufacturing method according to claim 6, wherein the step of etching with use of the oxygen containing gas is performed with use of supplementary gas for forming vapor of metal peroxide.

9. A manufacturing method according to claim 8, wherein the supplementary gas contains one of $CCl_2$, $SF_6$, $CH_4$, and $CCl_4$.

10. A manufacturing method according to claim 5, wherein the conductive metal oxide film is one of an oxide film of any one metal selected from a group of Mo, W, Tc, Re, Ru, Os, Rh, Ir, Pd, Pt, In, and Sn, and an oxide film of an alloy formed from metals in the group.

11. A manufacturing method according to claim 1, wherein the step of forming the gate electrode includes a step of forming the gate electrode includes a step of selectively etching the conductive metal oxide film to the gate insulating film.

12. A manufacturing method according to claim 11, wherein the step of selectively etching the conductive metal oxide film to the gate oxide film includes a step of etching the conductive metal oxide film with use of an oxygen containing gas.

13. A manufacturing method according to claim 12, wherein the oxygen containing gas contains at least one of $O_2$, NO, $NO_2$, $O_3$, and $CO_2$.

14. A manufacturing method of a semiconductor device, comprising the steps of:

forming a gate insulating film on a semiconductor substrate;

forming a conductive metal oxide film on the gate insulating film to make a stacked-layer film;

forming a gate electrode by etching the stacked-layer film using an oxygen containing gas.

15. A manufacturing method of a semiconductor device, comprising the steps of:

forming a gate insulating film on a semiconductor substrate;

forming a conductive metal oxide film on the gate insulating film;

forming a metal film on the conductive metal oxide film;

etching the metal film selectively to the conductive metal oxide film so as to expose the conductive metal oxide film; and etching the exposed conductive metal oxide film selectively to the gate insulating film in order to form a gate electrode, wherein the step of selectively etching the exposed conductive metal oxide film to the gate insulating film includes the step of etching the exposed conductive metal oxide film with an oxygen containing gas.

* * * * *